United States Patent
Koike et al.

(10) Patent No.: US 9,634,636 B2
(45) Date of Patent: Apr. 25, 2017

(54) NON-CONTACT POWER TRANSMISSION DEVICE

(71) Applicant: Kabushiki Kaisha Toyota Jidoshokki, Aichi-ken (JP)

(72) Inventors: Tsuyoshi Koike, Kariya (JP); Tadashi Kondo, Kariya (JP); Hiroshi Katsunaga, Kariya (JP); Yuichi Taguchi, Kariya (JP); Hiroki Togano, Kariya (JP); Keisuke Matsukura, Kariya (JP); Keisuke Inoue, Kariya (JP); Yuki Tsunekawa, Kariya (JP); Takuma Ono, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 226 days.

(21) Appl. No.: 14/410,861

(22) PCT Filed: Jun. 24, 2013

(86) PCT No.: PCT/JP2013/067222
§ 371 (c)(1),
(2) Date: Dec. 23, 2014

(87) PCT Pub. No.: WO2014/002940
PCT Pub. Date: Jan. 3, 2014

(65) Prior Publication Data
US 2015/0171820 A1 Jun. 18, 2015

(30) Foreign Application Priority Data

Jun. 25, 2012 (JP) ................................. 2012-142202

(51) Int. Cl.
*H02J 7/00* (2006.01)
*H03H 7/38* (2006.01)
(Continued)

(52) U.S. Cl.
CPC .............. *H03H 7/38* (2013.01); *B60L 11/182* (2013.01); *B60L 11/1824* (2013.01);
(Continued)

(58) Field of Classification Search
CPC ....................................................... H03H 7/38
(Continued)

(56) References Cited

U.S. PATENT DOCUMENTS 8,970,060 B2 * 3/2015 Ichikawa .............. B60L 11/123
307/10.1
9,437,362 B2 * 9/2016 Kim ......................... H01F 38/14
(Continued)

FOREIGN PATENT DOCUMENTS

EP 2346141 7/2011
EP 2409378 1/2012
(Continued)

OTHER PUBLICATIONS

European Patent Application No. 13810109.2: Extended European Search Report dated Jan. 20, 2016, 7 pages.
(Continued)

*Primary Examiner* — Richard V Muralidar
(74) *Attorney, Agent, or Firm* — Baker & Hostetler LLP

(57) ABSTRACT

A non-contact power transmission device equipped with a ground-side device and a vehicle-side device. The ground-side device has a primary-side coil to which alternating-current power is input. The vehicle-side device includes a secondary-side coil, a battery, a secondary-side matching device, and a charging device. The secondary-side coil receives alternating-current power from the primary-side coil in a non-contact manner. The secondary-side matching device is provided between the secondary-side coil and the battery, and has a predetermined fixed inductance and fixed capacitance. The charging device has a switching element
(Continued)

that performs a switching operation with a prescribed cycle. The charging device adjusts the duty ratio of the switching operation in accordance with the impedance of a load.

5 Claims, 1 Drawing Sheet

(51) Int. Cl.
*H02J 7/02* (2016.01)
*H02J 5/00* (2016.01)
*H01F 38/14* (2006.01)
*B60L 11/18* (2006.01)

(52) U.S. Cl.
CPC .......... *B60L 11/1861* (2013.01); *H01F 38/14* (2013.01); *H02J 5/005* (2013.01); *H02J 7/025* (2013.01); *B60L 2210/10* (2013.01); *B60L 2210/30* (2013.01); *B60L 2210/40* (2013.01); *B60L 2240/70* (2013.01); *B60L 2270/147* (2013.01); *Y02T 10/705* (2013.01); *Y02T 10/7005* (2013.01); *Y02T 10/7044* (2013.01); *Y02T 10/7072* (2013.01); *Y02T 10/7216* (2013.01); *Y02T 10/7241* (2013.01); *Y02T 10/7291* (2013.01); *Y02T 90/12* (2013.01); *Y02T 90/121* (2013.01); *Y02T 90/122* (2013.01); *Y02T 90/127* (2013.01); *Y02T 90/14* (2013.01); *Y02T 90/16* (2013.01)

(58) Field of Classification Search
USPC .................. 320/108, 109, 104; 307/10.7
See application file for complete search history.

(56) References Cited

U.S. PATENT DOCUMENTS

| 2011/0109263 | A1 | 5/2011 | Sakoda et al. |
| 2011/0231029 | A1 | 9/2011 | Ichikawa et al. |
| 2012/0119576 | A1* | 5/2012 | Kesler ............... B60L 11/182 307/10.1 |
| 2015/0028804 | A1* | 1/2015 | Nakashima ............ B60M 7/003 320/108 |

FOREIGN PATENT DOCUMENTS

| JP | 2009-106136 | | 5/2009 |
| JP | 2011-120443 | | 6/2011 |
| JP | 2011120443 A | * | 6/2011 |
| JP | 2011-155732 | | 8/2011 |
| JP | 2011-155733 | | 8/2011 |
| WO | WO 2010/035321 A1 | | 4/2010 |
| WO | WO 2010/108191 | | 9/2010 |

OTHER PUBLICATIONS

English translation of International Patent Application No. PCT/JP2013/067222: International Preliminary Report on Patentability dated Dec. 31, 2014, 5 pages.
English translation of Japanese Patent Application No. 2012-142202: Notification of Reasons for Refusal dated Jun. 17, 2016, 6 pages.

* cited by examiner

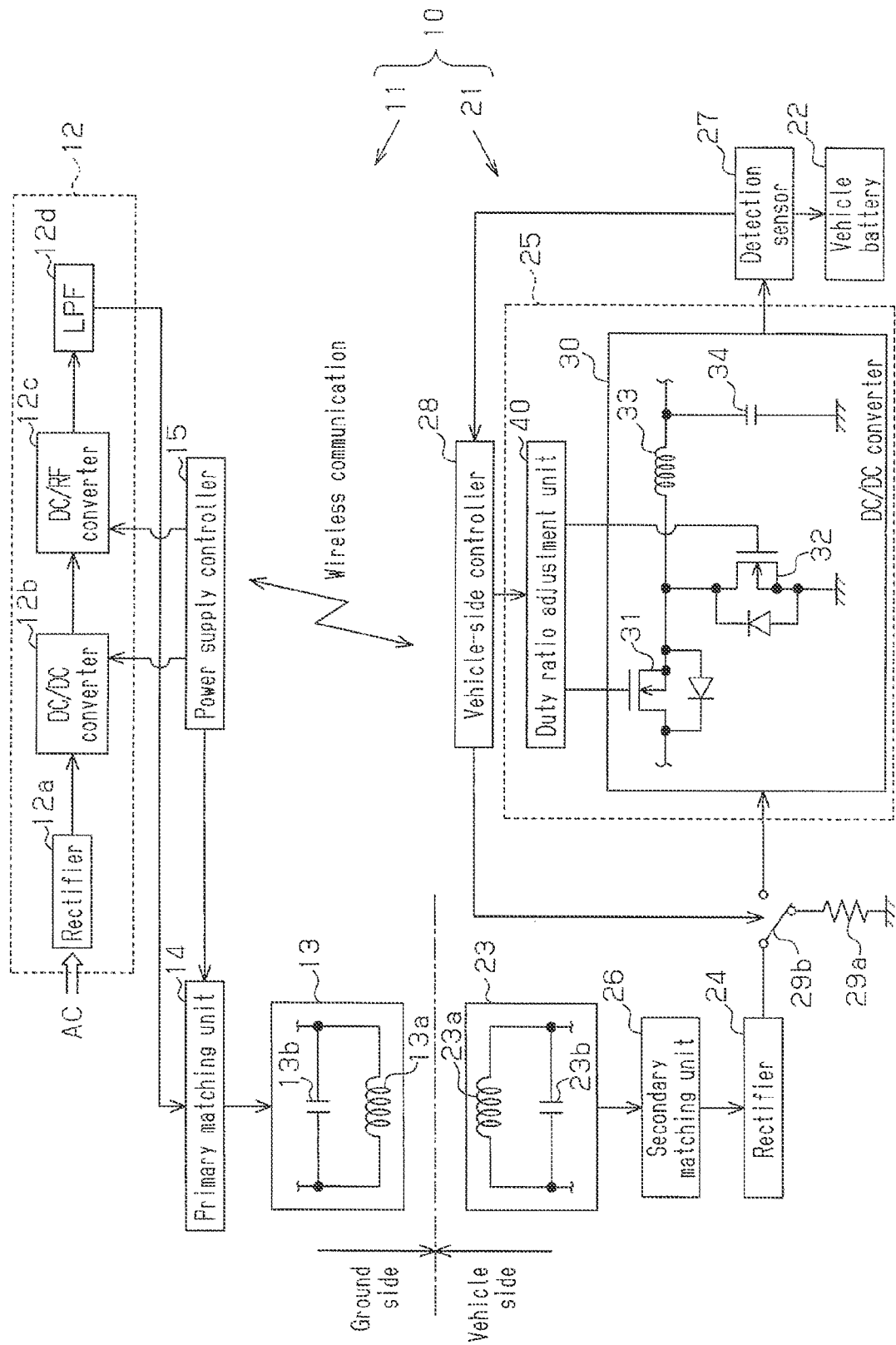

NON-CONTACT POWER TRANSMISSION DEVICE

CROSS-REFERENCE TO RELATED APPLICATIONS

This application is the National Stage of International Application No. PCT/JP2013/067222, filed Jun. 24, 2013, which claims the benefit of Japanese Application No. 2012-142202, filed Jun. 25, 2012, the disclosures of which are incorporated herein by reference in their entireties.

TECHNICAL FIELD

The present invention relates to a non-contact power transmission device.

BACKGROUND ART

In the prior art, for example, a device using magnetic field resonance is known as a non-contact power transmission device that does not use a power cord or a power transmission cable. For example, a non-contact power transmission device of patent document 1 includes a power supply device that includes an alternating current power supply and a primary resonance coil, which receives alternating current power from the alternating current power supply. Also, a vehicle, which is a power receiving device, includes a secondary resonance coil capable of performing magnetic field resonance with the primary resonance coil. When the primary resonance coil and the secondary resonance coil perform magnetic field resonance, the power supply device transmits alternating current power to the vehicle. The transmitted alternating current power is rectified to direct current by a rectifier located in the vehicle and input to a vehicle battery, which serves as a load. This charges the vehicle battery.

PRIOR ART DOCUMENT

Patent Document

Patent Document 1: Japanese Laid-Open Patent Publication No. 2009-106136

SUMMARY OF THE INVENTION

To improve the transmission efficiency, a non-contact power transmission device such as that described above may include, for example, a matching unit that performs impedance matching. However, when the matching unit is configured to have a fixed constant, if the impedance of a load changes as the amount of power supplied to the load changes, impedance matching cannot be accomplished. To follow such changes in the impedance of the load, a matching unit may be configured to have a variable constant so that variable control is performed on the matching unit. However, this would result in the matching unit being complicated and the variable control of the matching unit being complicated.

The above issue is not limited to a configuration in which non-contact power transmission is performed through magnetic field resonance and also arises when non-contact power transmission is performed through electromagnetic induction.

It is an object of the present invention to provide a non-contact power transmission device that can properly perform power transmission when the impedance of a load changes.

To achieve the above object, one aspect of a non-contact power transmission device according to the present invention includes a primary device and a secondary device. The primary device includes a primary coil that receives alternating current power. The secondary device includes a secondary coil, a load, a matching unit, and an adjustment unit. The secondary coil is configured to receive the alternating current power from the primary coil in a non-contact manner. The matching unit is located between the secondary coil and the load and has a predetermined fixed inductance and a predetermined fixed capacitance. The adjustment unit includes a switching element performing a switching operation in a predetermined cycle. The adjustment unit adjusts a duty ratio of the switching operation in accordance with an impedance of the load.

In this configuration, the impedance is adjusted by adjusting the duty ratio. Thus, when the impedance of the load changes, the duty ratio is adjusted in accordance with the change. As a result, an impedance from the output terminal of the matching unit to the load may be constant regardless of the change in the impedance of the load. In this case, there is no need to change the inductance and the capacitance of the matching unit in accordance with the change in the impedance of the load. Thus, the configuration of the matching unit may be simplified. Particularly, by adjusting the duty ratio of the adjustment unit following changes in the impedance of the load, the control of the matching unit may be simplified as compared to a configuration that performs variable control on the matching unit following changes in the impedance of the load.

Preferably, the primary device includes a variable matching unit that has at least one of a variable inductance and a variable capacitance.

In this configuration, the primary device includes the variable matching unit. This limits reflected power generated in the primary device.

Preferably, the secondary device includes a rectifier that rectifies alternating current power, which is received by the secondary coil, to direct current power. The adjustment unit includes a DC/DC converter that adjusts the duty ratio to convert a voltage of direct current power, which has been rectified by the rectifier, to a voltage of a different level and output the voltage of the different level to the load.

In this configuration, the DC/DC converter, which converts the voltage of the direct current power that is input to the load, functions as the adjustment unit. Thus, when a configuration includes a DC/DC converter so that direct current power of an appropriate voltage is input to a load, the existing configuration may be used and the matching unit may have a fixed constant.

Preferably, the secondary device is installed in a vehicle. The load includes a vehicle battery that is charged with the alternating current power received by the secondary coil. The adjustment unit adjusts the duty ratio in accordance with an impedance of the vehicle battery.

A vehicle battery needs a large charge capacity as compared to a battery of a cell phone or the like. Thus, the matching unit needs a capacitance and the like that withstands a high voltage. An element having such a capacitance and the like that withstands a high voltage may be unrealistic or very expensive. Further, such an element that is described above tends to be large in size. Thus, it is difficult to ensure a location space for such an element.

In contrast, the employed configuration adjusts the duty ratio following changes in the impedance of the vehicle battery. Thus, there is no need to include the above element. Consequently, the above problem may be avoided.

Preferably, the adjustment unit is located between the matching unit and the load. The adjustment unit adjusts the duty ratio so that an impedance from an output terminal of the matching unit to the load is constant regardless of a change in impedance of the load.

Another aspect of a non-contact power transmission device according to the present invention includes a secondary coil configured to receive alternating current power in a non-contact manner from a power transmitting device including a primary coil that receives the alternating current power. The power receiving device includes a load, a matching unit, and an adjustment unit. The load receives the alternating current power received by the secondary coil. The matching unit is located between the secondary coil and the load. The matching unit has a predetermined fixed inductance and a predetermined fixed capacitance. The adjustment unit includes a switching element performing a switching operation in a predetermined cycle. The adjustment unit adjusts a duty ratio of the switching operation in accordance with an impedance of the load.

BRIEF DESCRIPTION OF THE DRAWING

FIG. 1 is a block diagram showing the electrical configuration of a non-contact power transmission device according to the present invention.

DETAILED DESCRIPTION OF THE PREFERRED EMBODIMENTS

A non-contact power transmission device (non-contact power transmission system) according to the present invention will now be described.

As shown in FIG. 1, a non-contact power transmission device 10 includes a ground-side device 11 that is located on the ground and a vehicle-side device 21 that is installed in a vehicle. The ground-side device 11 corresponds to a primary device (power transmitting device), and the vehicle-side device 21 corresponds to a secondary device (power receiving device).

The ground-side device 11 includes a high frequency power supply 12 (alternating current power supply) that is capable of outputting high frequency power (alternating current power) in a predetermined frequency. The high frequency power supply 12 is configured to be capable of outputting high frequency power having a sine-wave using system power. More specifically, the high frequency power supply 12 includes a rectifier 12a, which rectifies the system power to direct current power, and a DC/DC converter 12b, which converts the voltage of the direct current power. Additionally, the high frequency power supply 12 includes a DC/RF converter 12c and a low-pass filter 12d. The DC/RF converter 12c uses the direct current power output from the DC/DC converter 12b to generate high frequency power having a rectangular wave. The low-pass filter 12d shapes the rectangular wave high frequency power, which is generated by the DC/RF converter 12c, to the sine-wave high frequency power. The high frequency power supply 12 is configured to be capable of adjusting an output voltage of the DC/DC converter 12b to output high frequency power of different levels. In the description hereafter, the sine-wave high frequency power is simply referred to as high frequency power.

The vehicle-side device 21 receives high frequency power from the high frequency power supply 12 in a non-contact manner. The high frequency power is used to charge a vehicle battery 22 (power storage device) located in the vehicle-side device 21. More specifically, the non-contact power transmission device 10, which performs power transmission between the ground-side device 11 and the vehicle-side device 21, includes a transmitter 13 located in the ground-side device 11 and a receiver 23 located in the vehicle-side device 21. High frequency power is input to the transmitter 13 via a primary matching unit 14, which serves as a variable matching unit located in the ground-side device 11.

The transmitter 13 and the receiver 23 are configured to be capable of performing magnetic field resonance. More specifically, the transmitter 13 is formed by a resonance circuit that includes a primary coil 13a and a primary capacitor 13b connected in parallel. The receiver 23 is formed by a resonance circuit that includes a secondary coil 23a and a secondary capacitor 23b connected in parallel. The transmitter 13 and the receiver 23 are set to have the same resonance frequency.

In this configuration, when the transmitter 13 (primary coil 13a) receives high frequency power from the high frequency power supply 12, the transmitter 13 (primary coil 13a) and the receiver 23 (secondary coil 23a) perform magnetic field resonance. Consequently, the receiver 23 receives some of the energy of the transmitter 13. That is, the receiver 23 receives high frequency power from the transmitter 13.

The vehicle-side device 21 includes a rectifier 24, which serves as a rectifying unit that rectifies the high frequency power received by the receiver 23 to direct current power, and a charger 25, which serves as an adjustment unit located between the rectifier 24 and the vehicle battery 22. The charger 25 converts the voltage of the direct current power rectified by the rectifier 24 to a predetermined voltage and outputs the direct current power having the predetermined voltage to the vehicle battery 22. In this manner, the direct current power is input to the vehicle battery 22, and the vehicle battery 22 is charged. The vehicle battery 22 is a load having impedance that changes in accordance with the amount of the input direct current power.

Also, the vehicle-side device 21 includes a secondary matching unit 26, which serves as a matching unit located between the receiver 23 and the rectifier 24, and a detection sensor 27, which is located between the charger 25 and the vehicle battery 22 and detects the state of charge of the vehicle battery 22. That is, a power transmission line is formed from the receiver 23 (secondary coil 23a) via the secondary matching unit 26, the rectifier 24, the charger 25, and the detection sensor 27 to the vehicle battery 22.

The primary matching unit 14, which is located between the high frequency power supply 12 and the transmitter 13, is configured to have at least one of a variable inductance and a variable capacitance. In the present embodiment, the capacitance is variable. More specifically, the primary matching unit 14 is formed by an LC circuit that includes a coil and a variable capacitor. The primary matching unit 14 varies the capacitance of the variable capacitor to match the impedance of an output terminal of the high frequency power supply 12 with the impedance from an input terminal of the primary matching unit 14 to the vehicle battery 22. Although not shown in the drawings, the ground-side device 11 includes a measurement unit that measures reflected power directed toward the high frequency power supply 12.

The secondary matching unit 26, which is located between the receiver 23 and the rectifier 24, has a fixed inductance and a fixed capacitance. That is, the secondary matching unit 26 has a fixed constant.

The ground-side device 11 includes a power supply controller 15, which controls the primary matching unit 14 and the high frequency power supply 12, more specifically, the DC/DC converter 12b and the DC/RF converter 12c. The power supply controller 15 is configured to receive measurement results from the measurement unit. Thus, the power supply controller 15 can recognize the reflected power directed toward the high frequency power supply 12 and variably controls the constant of the primary matching unit 14 based on the reflected power.

The vehicle-side device 21 includes a vehicle-side controller 28, which controls the charger 25. The vehicle-side controller 28 is configured to receive detection results from the detection sensor 27. Thus, the vehicle-side controller 28 can recognize the state of charge of the vehicle battery 22.

Also, the vehicle-side device 21 includes an adjustment resistor 29a, which is connected in parallel to the charger 25, and a switch 29b, which switches the connected subject (of an output terminal) of the rectifier 24 between the charger 25 and the adjustment resistor 29a. The resistance of the adjustment resistor 29a is set to be the same as the impedance from an input terminal of the charger 25 (output terminal of the rectifier 24) to the vehicle battery 22 when receiving the high frequency power for charging.

The controllers 15 and 28 are configured to be capable of performing wireless communication and exchanging information with each other. While exchanging information, the controllers 15 and 28 each perform control related to the charging of the vehicle battery 22.

The charger 25 will now be described in detail.

The charger 25 includes a DC/DC converter 30. The DC/DC converter 30 converts the voltage of the direct current power, which is output from the rectifier 24, to a voltage of a different level and outputs the voltage of the different level toward the vehicle battery 22.

The DC/DC converter 30 includes two switching elements 31 and 32, a coil 33, and a capacitor 34. Each of the switching elements 31 and 32 is formed, for example, by an n-type power MOSFET. Alternatively, an IGBT or the like may be used.

The drain of a first switching element 31 is connected to an input terminal of the DC/DC converter 30, that is, an output of the rectifier 24. The source of the first switching element 31 is connected to a first terminal of the coil 33 and the drain of a second switching element 32. The source of the second switching element 32 is grounded. A second terminal of the coil 33 is connected to an output terminal of the DC/DC converter 30 and connected to the vehicle battery 22 through the detection sensor 27. A first terminal of the capacitor 34 is connected to the second terminal of the coil 33. A second terminal of the capacitor 34 is grounded.

In this configuration, when the switching elements 31 and 32 periodically perform switching operations (activation and deactivation, chopping) so that the switching elements 31 and 32 are alternately activated, the DC/DC converter 30 outputs, from the output terminal, direct current power having a voltage corresponding to a duty ratio of the switching operation performed in each switching element 31 and 32. In other words, the DC/DC converter 30 outputs, from the output terminal, direct current power having a voltage corresponding to the pulse width of a pulse wave generated by the periodic switching operation performed in each switching element 31 and 32.

The charger 25 includes a duty ratio adjustment unit 40 that controls the duty ratio of the switching operation of each switching element 31 and 32. The duty ratio adjustment unit 40 is connected to the gate of each switching element 31 and 32. The duty ratio adjustment unit 40 controls the gate voltage of each switching element 31 and 32 so that the duty ratio is controlled. In other words, the duty ratio adjustment unit 40 outputs a pulse wave in a predetermined cycle to the gate of each switching element 31 and 32 and performs pulse-width modulation on the pulse wave.

The charging control performed by each controller 15 and 28 will now be described.

When a vehicle is located where the vehicle can be charged, more specifically, when the vehicle is located at a position that enables the transmitter 13 (primary coil 13a) and the receiver 23 (secondary coil 23a) to perform magnetic field resonance, the vehicle-side controller 28 transmits a chargeable signal to the power supply controller 15.

When receiving the chargeable signal, the power supply controller 15 controls the high frequency power supply 12 (more specifically, DC/DC converter 12b) to output the high frequency power for matching and notifies the vehicle-side controller 28 of the transmission of the high frequency power for matching. The high frequency power for matching is smaller than the high frequency power for charging, which is output when charging is performed.

When receiving a signal indicating the transmission of the high frequency power for matching from the power supply controller 15, the vehicle-side controller 28 switches the switch 29b so that the output terminal of the rectifier 24 is connected to the adjustment resistor 29a. Then, the power supply controller 15 performs impedance matching by adjusting the constant of the primary matching unit 14 (capacitance of the variable capacitor) based on the measurement result of the measurement unit to decrease the reflected power.

When the impedance matching is completed (finished), the power supply controller 15 notifies the vehicle-side controller 28 of the transmission of the high frequency power for charging and controls the high frequency power supply 12 to output the high frequency power for charging.

When receiving a signal indicating the transmission of the high frequency power for charging from the power supply controller 15, the vehicle-side controller 28 switches the switch 29b so that the output terminal of the rectifier 24 is connected to the charger 25. This starts charging the vehicle battery 22.

The constant of the secondary matching unit 26 is set so that impedance from the high frequency power supply 12 to an output terminal of the receiver 23 is matched to impedance from an input terminal of the secondary matching unit 26 to the adjustment resistor 29a. The impedance from the input terminal of the secondary matching unit 26 to the adjustment resistor 29a is the same as the impedance from the input terminal of the secondary matching unit 26 to the vehicle battery 22 when receiving the high frequency power for charging. Therefore, when the high frequency power for charging is output and the output terminal of the rectifier 24 is connected to the charger 25, the secondary matching unit 26 maintains a high matching degree.

The detection sensor 27 periodically transmits the state of charge of the vehicle battery 22 to the vehicle-side controller 28 when charging is performed.

When the detection sensor 27 detects that the state of charge of the vehicle battery 22 is close to a fully charged state, the vehicle-side controller 28 transmits an instruction to the power supply controller 15 so that the high frequency power supply 12 transmits high frequency power (hereinafter, referred to as push-charge power) that is lower than the high frequency power for charging. When receiving the instruction to change the amount of power, the power supply controller 15 controls the high frequency power supply 12 to output the push-charge power.

The vehicle-side controller 28 controls the DC/DC converter 30 so that the impedance from the output terminal of the secondary matching unit 26 to the vehicle battery 22 does not change regardless of the change from the high frequency power for charging to the push-in charge power. More specifically, the vehicle-side controller 28 controls the duty ratio so that the impedance from the output terminal of the secondary matching unit 26 to the vehicle battery 22 when receiving the push-in charge power is the same as the impedance (resistance of the adjustment resistor 29a) from the output terminal of the secondary matching unit 26 to the vehicle battery 22 when receiving the high frequency power for charging.

When the charging of the vehicle battery 22 is completed (finished), the vehicle-side controller 28 outputs a charge completion signal (charge finish signal) to the power supply controller 15. When receiving the charge completion signal, the power supply controller 15 controls the high frequency power supply 12 to stop outputting high frequency power.

The operation of the non-contact power transmission device 10 of the present embodiment will now be described.

The change in the high frequency power output from the high frequency power supply 12 changes the amount of input power in the vehicle battery 22 and the impedance of the vehicle battery 22. In accordance with the change in the impedance of the vehicle battery 22, the duty ratio of the switching operation of each switching element 31 and 32 is adjusted so that the impedance from the output terminal of the secondary matching unit 26 to the vehicle battery 22 is constant. As a result, the impedance from the output terminal of the secondary matching unit 26 to the vehicle battery 22 is constant regardless of the amount of the high frequency power output from the high frequency power supply 12 (the amount of the high frequency power received by the receiver 23).

As described above, the primary matching unit 14 is arranged to match output impedance of the high frequency power supply 12 to input impedance of the primary matching unit 14. This decreases the reflected power. Additionally, the constant of the primary matching unit 14 is variably controlled to decrease the reflected power. This allows for maintenance of the high matching degree even when the relative positions of the coils 13a and 23a are separated from reference positions.

The relative positions of the coils 13a and 23a include not only the distance between the coils 13a and 23a but also the axial direction of the coils 13a and 23a, overlapping of the coils 13a and 23a, and the like. The overlapping of the coils 13a and 23a includes, for example, positional deviation of the primary and secondary coils 13a and 23a as viewed from above when the transmitter 13 and the receiver 23 are located one above the other.

When the constant of the primary matching unit 14 is variably controlled, the rectifier 24 is connected to the adjustment resistor 29a. This eliminates the need to consider impedance changes of the vehicle battery 22 when variably controlling the constant of the primary matching unit 14.

Further, when performing the variable control on the constant of the primary matching unit 14, the high frequency power supply 12 outputs the high frequency power for matching, which is lower than the high frequency power for charging. This decreases power loss that is used during the matching of the primary matching unit 14.

After the variable control on the constant of the primary matching unit 14 is finished, the switch 29b is switched and the high frequency power for charging is output. In this case, the resistance of the adjustment resistor 29a is set to be the same as the impedance from the input terminal of the charger 25 to the vehicle battery 22 when receiving the high frequency power for charging. This results in unchanged impedance in a location subsequent to the output terminal of the rectifier 24 before and after switching the switch 29b. Thus, even when the switch 29b is switched, the matching degree of each matching unit 14 and 26 will not be lowered.

Accordingly, the present embodiment has the advantages described below.

(1) The duty ratio of the switching operation of each switching element 31 and 32 in the DC/DC converter 30 of the charger 25 is adjusted in accordance with a change in impedance of the vehicle battery 22 as the high frequency power output from the high frequency power supply 12 changes. More specifically, the duty ratio is adjusted so that a impedance from the output terminal of the secondary matching unit 26 to the vehicle battery 22 is constant. This eliminates the need to perform variable control on the secondary matching unit 26 following changes in the impedance of the vehicle battery 22. Thus, the secondary matching unit 26 may have a simple configuration. Also, the duty ratio of the charger 25 is adjusted following changes in the impedance of the vehicle battery 22. This simplifies the control of the secondary matching unit 26 as compared to a configuration that performs variable control on a secondary matching unit following changes in the impedance of a vehicle battery.

(2) Particularly, the vehicle battery 22 needs a large charge capacity as compared to a battery of a cell phone or the like. Thus, the secondary matching unit 26 needs a capacitance and the like that withstands a high voltage. An element having such a capacitance and the like that withstands a high voltage may be unrealistic or very expensive. Further, such an element that is described above tends to be large in size. Thus, it is difficult to ensure space for such an element.

In contrast, the present embodiment employs a configuration that adjusts the duty ratio following changes in the impedance of the vehicle battery 22. Thus, there is no need to include the above element. Consequently, the above problem may be avoided.

(3) To variably control the constant of the primary matching unit 14, the output terminal of the rectifier 24 is configured to be connected to the adjustment resistor 29a. This eliminates a need to consider impedance change of the vehicle battery 22 when performing the variable control on the constant of the primary matching unit 14. Thus, the variable control may be easily performed on the constant of the primary matching unit 14.

(4) When the connected subject of the output terminal of the rectifier 24 is switched from the adjustment resistor 29a to the charger 25, the output power of the high frequency power supply 12 is changed from the high frequency power for matching to the high frequency power for charging. In this configuration, the resistance of the adjustment resistor 29a is set to be the same as the impedance from the input terminal of the charger 25 to the vehicle battery 22 when receiving the high frequency power for charging. This results in unchanged impedance in a location subsequent to the output terminal of the rectifier 24 between before and after switching the switch 29b. Thus, in a configuration that performs matching and charging with different levels of power, decreases in the matching degree of the matching units 14 and 26 can be limited.

(5) The DC/DC converter 30, which includes the switching elements 31 and 32, converts the voltage of the direct current power output from the rectifier 24 to a desired voltage for the vehicle battery 22. That is, the DC/DC converter 30, which is used to charge the vehicle battery 22, is able to follow changes in the impedance of the vehicle battery 22. Thus, the existing configuration may be used.

The above embodiment may be modified as follows.

In the embodiment, the DC/DC converter 30 includes the two switching elements 31 and 32. However, there is no limit to such a configuration. The second switching element 32 may be omitted. In this case, a diode may be used in lieu of the second switching element 32.

A step-down converter is employed as the DC/DC converter 30 of the charger 25. Instead, a step-up converter may be employed. The DC/DC converter only needs to include at least one switching element and to change voltage based on the duty ratio of a switching operation of the switching element.

When taking into consideration the change in reflected power from the vehicle battery 22 as the impedance of the vehicle battery 22 changes, the embodiment may be configured to measure reflected power from the vehicle battery 22 and adjust the duty ratio based on the reflected power.

In the embodiment, the ground-side device 11 and the vehicle-side device 21 each include one matching unit (primary matching unit 14 and secondary matching unit 26). Instead, for example, the ground-side device 11 may include two matching units, the vehicle-side device 21 may include two matching units, or the ground-side device 11 and the vehicle-side device 21 may each include two matching units. In this case, one of the matching units that is closer to the transmitter 13 in the ground-side device 11 is adjusted to have a constant that decreases reflected power from the transmitter 13, and one of the matching units that is closer to the receiver 23 in the vehicle-side device 21 is adjusted to have a constant that decreases reflected power from the vehicle battery 22 to the receiver 23. Additionally, one of the matching units that is closer to the high frequency power supply 12 in the ground-side device 11 is adjusted to have a constant that improves the power factor, and one of the matching units that is closer to the vehicle battery 22 in the vehicle-side device 21 is adjusted to have a constant that decreases reflected power from the vehicle battery 22. Even in this configuration, by adjusting the duty ratio, the matching unit that is closer to the vehicle battery 22 in the vehicle-side device 21 may have a fixed constant.

In the embodiment, when the high frequency power output from the high frequency power supply 12 is changed in amount, the control is performed, by adjusting the duty ratio, so that the impedance from the output terminal of the secondary matching unit 26 to the vehicle battery 22 is constant. However, there is no limit to such a configuration. For example, the state of charge of the vehicle battery 22 may be periodically detected while the vehicle battery 22 is charged. Then, impedance of the vehicle battery 22 may be estimated based on a detection result so that the duty ratio is adjusted based on the impedance. Thus, changes in the impedance of the vehicle battery 22 can be followed when the state of charge of the vehicle battery 22 changes.

The impedance matching performed by the primary matching unit 14 does not have to be based on the measured reflected power. For example, the primary matching unit 14 may perform impedance matching based on the impedance directly measured from the input terminal of the primary matching unit 14 to the adjustment resistor 29a.

The constant of the primary matching unit 14 may be adjusted so that a desired output power is obtained or the power factor is improved.

In the embodiment, the duty ratio is set to maintain an impedance from the input terminal of the secondary matching unit 26 to the vehicle battery 22 constant. However, there is no limit to such a configuration. For example, the duty ratio may be adjusted to increase the direct current power, which is input to the vehicle battery 22, when the impedance from the input terminal of the secondary matching unit 26 to the vehicle battery 22 is within a predetermined allowable range. This realizes both impedance matching and a quick charge of the vehicle battery 22. However, when taking into consideration power loss and the like resulting from reflected power, it is preferred that the duty ratio be adjusted to maintain the impedance constant.

In the embodiment, adjustment of a duty ratio of a switching operation is performed in each switching element 31 and 32 of the DC/DC converter 30. However, there is no limit to such a configuration. It is only needed to include a switching element and provide a circuit that adjusts a duty ratio of a switching operation of the switching element to change impedance.

The transmitter 13 may additionally include a primary induction coil that is coupled to the resonance circuit formed by the primary coil 13a and the primary capacitor 13b by electromagnetic induction. In this case, the primary induction coil is connected to the high frequency power supply 12. The resonance circuit receives high frequency power from the primary induction coil by electromagnetic induction. In the same manner, the receiver 23 may include a secondary induction coil that is coupled to the resonance circuit formed by the secondary coil 23a and the secondary capacitor 23b by electromagnetic induction. Power may be drawn from the resonance circuit of the receiver 23 using the secondary induction coil.

The wave form of high frequency power output from the high frequency power supply 12 is not limited to a sine wave and may be, for example, a pulse wave.

The capacitors 13b and 23b may be omitted from the embodiment. In this case, preferably, magnetic field resonance is performed using a parasitic capacitor of each coil 13a and 23a.

The embodiment uses magnetic field resonance to accomplish non-contact power transmission. However, there is no limit to such a configuration. Electromagnetic induction may be used.

In the embodiment, the ground-side device 11 is located on the ground. However, there is no limit to such a configuration. The ground-side device 11 only needs to be located at a position where a vehicle can be charged. For example, when a garage is located in a parking space, the ground-side device 11 may be located on a wall of the garage.

In the embodiment, the vehicle-side device 21 is installed in a vehicle. However, there is no limit to such a configuration. A device that is equivalent to the vehicle-side device 21 of the embodiment may be installed in a different device such as a cell phone.

In the embodiment, high frequency power received by the receiver 23 is used to charge the vehicle battery 22. However, there is no limit to such a configuration. For example, the high frequency power may be used to drive another electronic device located in the vehicle. It is only needed to connect the receiver 23 (secondary coil 23a) and a load, which has an impedance that changes in accordance with the condition, and to locate the DC/DC converter 30 in between.

A capacitor or an inductor may be additionally arranged between the input terminal of the rectifier 24 and the vehicle battery 22 so that the imaginary component of the impedance from the input terminal of the rectifier 24 to the vehicle battery 22 becomes close to "zero".

In the embodiment, the vehicle-side controller 28 transmits an instruction to change from charging high frequency power to push-charge power. However, there is no limit to such a configuration. The power supply controller may directly perform the above change. In this case, the vehicle-side controller 28 periodically transmits the state of charge of the vehicle battery 22 to the power supply controller 15 so that the power supply controller 15 recognizes the state of charge of the vehicle battery 22.

In the embodiment, the adjustment resistor 29a and the switch 29b is arranged in a subsequent stage of the rectifier 24. However, there is no limit to such a configuration. The adjustment resistor 29a and the switch 29b may be arranged in a preceding stage of the rectifier 24. In this case, preferably, the resistance of the adjustment resistor 29a is set to be the same as the impedance from the input terminal of the rectifier 24 (output terminal of the secondary matching unit 26) to the vehicle battery 22 when receiving high frequency power for charging. In this configuration, even when the receiver 23 receives high frequency power for matching the voltage of which is lower than the voltage that enables the rectifier 24 to operate, the constant of each matching unit 14 and 26 may be variably controlled.

The high frequency power supply 12 may be omitted from the embodiment. In this case, the primary matching unit 14 is connected to the system power.

The invention claimed is:

1. A non-contact power transmission device comprising:
   a primary device including a primary coil that receives alternating current power; and
   a secondary device including
   a secondary coil that is configured to receive the alternating current power from the primary coil in a non-contact manner,
   a rectifier that rectifies alternating current power, which is received by the secondary coil, to direct current power,
   a load,
   a matching unit that is located between the secondary coil and the load and has a predetermined fixed inductance and a predetermined fixed capacitance, and
   an adjustment unit that includes a switching element performing a switching operation in a predetermined cycle, wherein the adjustment unit adjusts a duty ratio of the switching operation in accordance with an impedance of the load, wherein
   the adjustment unit includes a DC/DC converter that adjusts the duty ratio to convert a voltage of direct current power, which has been rectified by the rectifier, to a voltage of a different level and output the voltage of the different level to the load, and
   the secondary device further includes:
   a resistor connected in parallel to the DC/DC converter and the load, and
   a switch that switches a connected subject of the rectifier between the DC/DC converter and the resistor, wherein
   a resistance of the resistor is set to be the same as an impedance from an output terminal of the matching unit to the load, and
   the adjustment unit adjusts the duty ratio so that the impedance from an output terminal of the matching unit to the load is constant regardless of the impedance of the load.

2. The non-contact power transmission device according to claim 1, wherein the primary device includes a variable matching unit that has at least one of a variable inductance and a variable capacitance.

3. The non-contact power transmission device according to claim 1, wherein
   the secondary device is installed in a vehicle,
   the load includes a vehicle battery that is charged by receiving the direct current outputted from the DC/DC converter, and
   the adjustment unit adjusts the duty ratio so that the impedance from the output terminal of the matching unit to the vehicle battery is constant regardless of the impedance of the vehicle battery.

4. The non-contact power transmission device according to claim 1, wherein
   the adjustment unit is located between the matching unit and the load.

5. A power receiving device including a secondary coil configured to receive alternating current power in a non-contact manner from a power transmitting device including a primary coil that receives the alternating current power, the power receiving device comprising:
   a rectifier that rectifies alternating current power, which is received by the secondary coil, to direct current power,
   a load;
   a matching unit located between the secondary coil and the load, wherein the matching unit has a predetermined fixed inductance and a predetermined fixed capacitance; and
   an adjustment unit that includes a switching element performing a switching operation in a predetermined cycle, wherein the adjustment unit adjusts a duty ratio of the switching operation in accordance with an impedance of the load, wherein
   the adjustment unit includes a DC/DC converter that adjusts the duty ratio to convert a voltage of direct current power, which has been rectified by the rectifier, to a voltage of a different level and output the voltage of the different level to the load, and
   the power receiving device further includes:
   a resistor connected in parallel to the DC/DC converter and the load, and
   a switch that switches a connected subject of the rectifier between the DC/DC converter and the resistor, wherein
   the adjustment unit adjusts the duty ratio so that an impedance from an output terminal of the matching unit to the load is constant regardless of the impedance of the load.

* * * * *